US012635506B2

(12) United States Patent
Clampitt et al.

(10) Patent No.: US 12,635,506 B2
(45) Date of Patent: May 19, 2026

(54) MICROELECTRONIC DEVICES INCLUDING STAIR STEP STRUCTURES, AND RELATED ELECTRONIC SYSTEMS AND METHODS

(71) Applicant: Micron Technology, Inc., Boise, ID (US)

(72) Inventors: Darwin A. Clampitt, Wilder, ID (US); Amber Thompson, Meridian, ID (US); Shruthi Kumara Vadivel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 573 days.

(21) Appl. No.: 17/644,937

(22) Filed: Dec. 17, 2021

(65) Prior Publication Data

US 2023/0197608 A1     Jun. 22, 2023

(51) Int. Cl.
| | |
|---|---|
| *H01L 23/528* | (2006.01) |
| *H01L 21/768* | (2006.01) |
| *H10B 41/27* | (2023.01) |
| *H10B 43/27* | (2023.01) |
| *H10W 20/00* | (2026.01) |
| *H10W 20/43* | (2026.01) |

(52) U.S. Cl.
CPC ............ *H10W 20/43* (2026.01); *H10B 41/27* (2023.02); *H10B 43/27* (2023.02); *H10W 20/01* (2026.01)

(58) Field of Classification Search
CPC ..... H01L 23/528; H01L 21/768; H10B 41/27; H10B 43/27; H10B 43/50
See application file for complete search history.

(56) References Cited

U.S. PATENT DOCUMENTS

| | | | |
|---|---|---|---|
| 2019/0081061 A1* | 3/2019 | Tessariol | H01L 21/76877 |
| 2021/0057336 A1* | 2/2021 | Shao | G11C 5/063 |
| 2021/0242128 A1* | 8/2021 | Ito | H10B 43/10 |
| 2021/0272900 A1* | 9/2021 | Shin | H01L 21/76816 |
| 2021/0296334 A1* | 9/2021 | Zhang | H10B 43/50 |
| 2021/0366920 A1* | 11/2021 | Tokita | H10D 84/038 |

* cited by examiner

*Primary Examiner* — Fernando L Toledo
*Assistant Examiner* — Marshall Mu-Nuo Hatfield
(74) *Attorney, Agent, or Firm* — TraskBritt

(57) ABSTRACT

A microelectronic device includes a stack structure having a vertically alternating sequence of conductive structures and insulating structures arranged in tiers. The stack structure further includes a first block having first stadium structures having steps having horizontal ends of the tiers, an arrangement of the first stadium structures ascending from a lowermost first stadium structure to an uppermost first stadium structure in a first horizontal direction and a second block neighboring the first block in a second horizontal direction orthogonal to the first horizontal direction and having second stadium structures having additional steps having additional horizontal ends of the tiers, an arrangement of second stadium structures descending from an uppermost second stadium structure to a lowermost second stadium structure in the first horizontal direction. Related methods and electronic systems are also disclosed.

15 Claims, 8 Drawing Sheets

100

152

140

110

101b

103a

113

113

103a

113

113

101a

125

103b

125

103b

164

162

140

168

127

703

MICROELECTRONIC DEVICES INCLUDING STAIR STEP STRUCTURES, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures, the quantity of steps in individual staircase structures, and depth of stadium structures of staircase structures) of a stack structure without undesirably increasing the overall width (e.g., lateral footprint) of the stack structure can result in instability of staircase structures and undesirable overlap of material removal processes during formation of relatively deep portions of the staircase structures, leading to failure of the vertical memory array.

DETAILED DESCRIPTION

Figure 1:
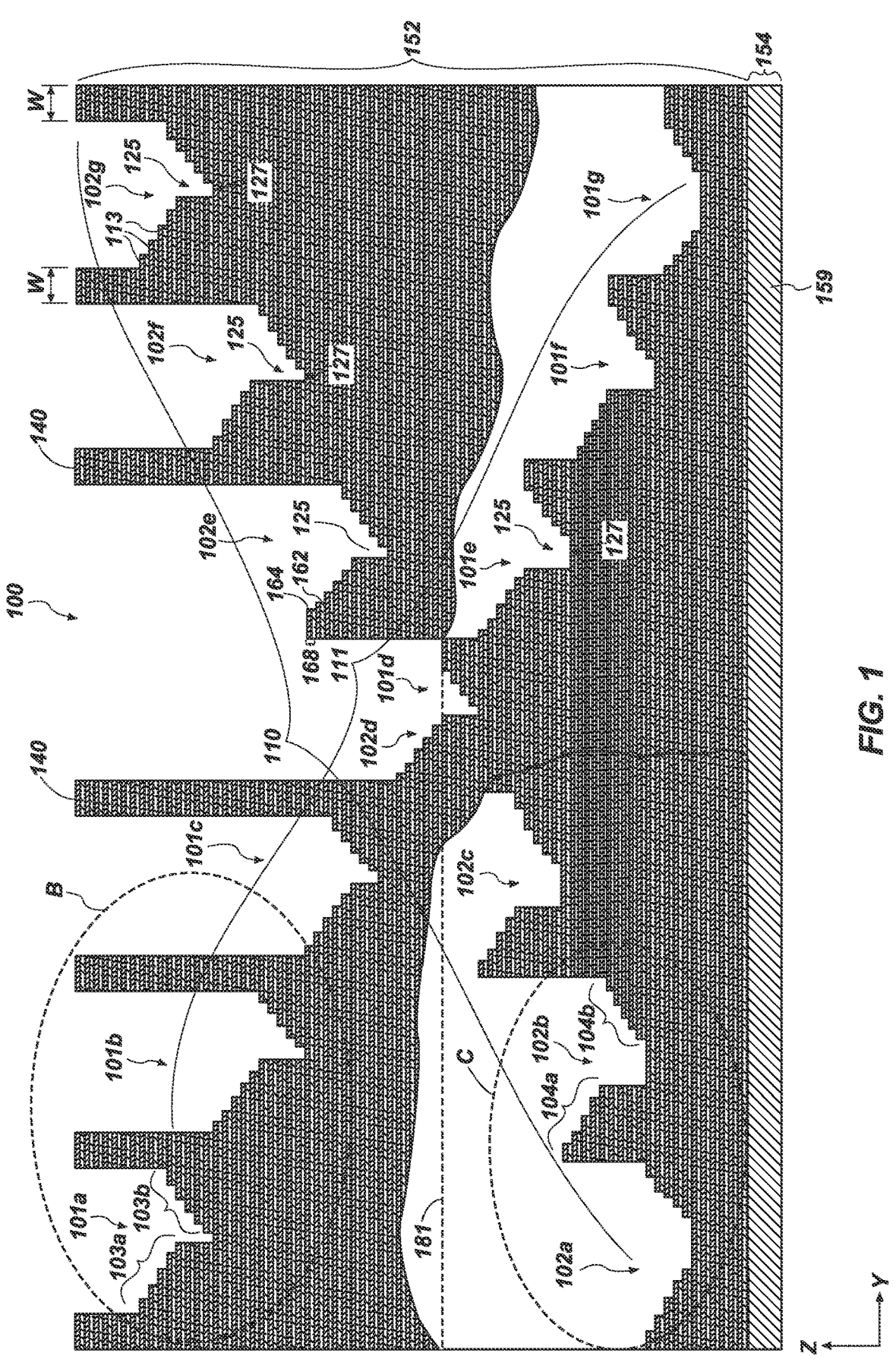
FIG. 1 a simplified, partial cross-sectional view of a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular (e.g., normal) to the major plane of the substrate. The major plane of the substrate is defined by a surface of the substrate having a relatively large area compared to other surfaces of the substrate. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, a material is "selectively etchable" relative to another material if the material exhibits an etch rate that is at least about five times (5×) greater than the etch rate of another material during exposure to the same etching agent (e.g., etchant), such as about ten times (10×) greater, about twenty times (20×) greater, or about forty times (40×) greater.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

Embodiments described herein include microelectronic device structures having complementary stadium depths that are alternated on every other word line structure. In particular, lower (e.g., deep) stadium structures within first blocks of a stack structure are formed laterally neighboring (e.g., adjacent) to upper (e.g., shallow) stadium structures of second blocks of the stack structure laterally neighboring the first blocks. Accordingly, lower stadium structures within laterally neighboring blocks are relatively distal from one another, and upper stadium structures within the laterally neighboring blocks are also relatively distal from one another. Put another way, lower stadium structures are not laterally neighboring to each other within laterally neighboring blocks, and upper stadium structures are not laterally neighboring to each other within laterally neighboring blocks. Furthermore, in some embodiments, the stadium structures of two laterally neighboring blocks may generally form an X-shape when viewed from a plane to which upper surfaces of steps of the stadium structures are normal.

Figure 2:
FIG. 2 is an enlarged view of the microelectronic device structure of FIG. 1 within view window B depicted in FIG. 1, in accordance with embodiments of the disclosure.
Figure 3:
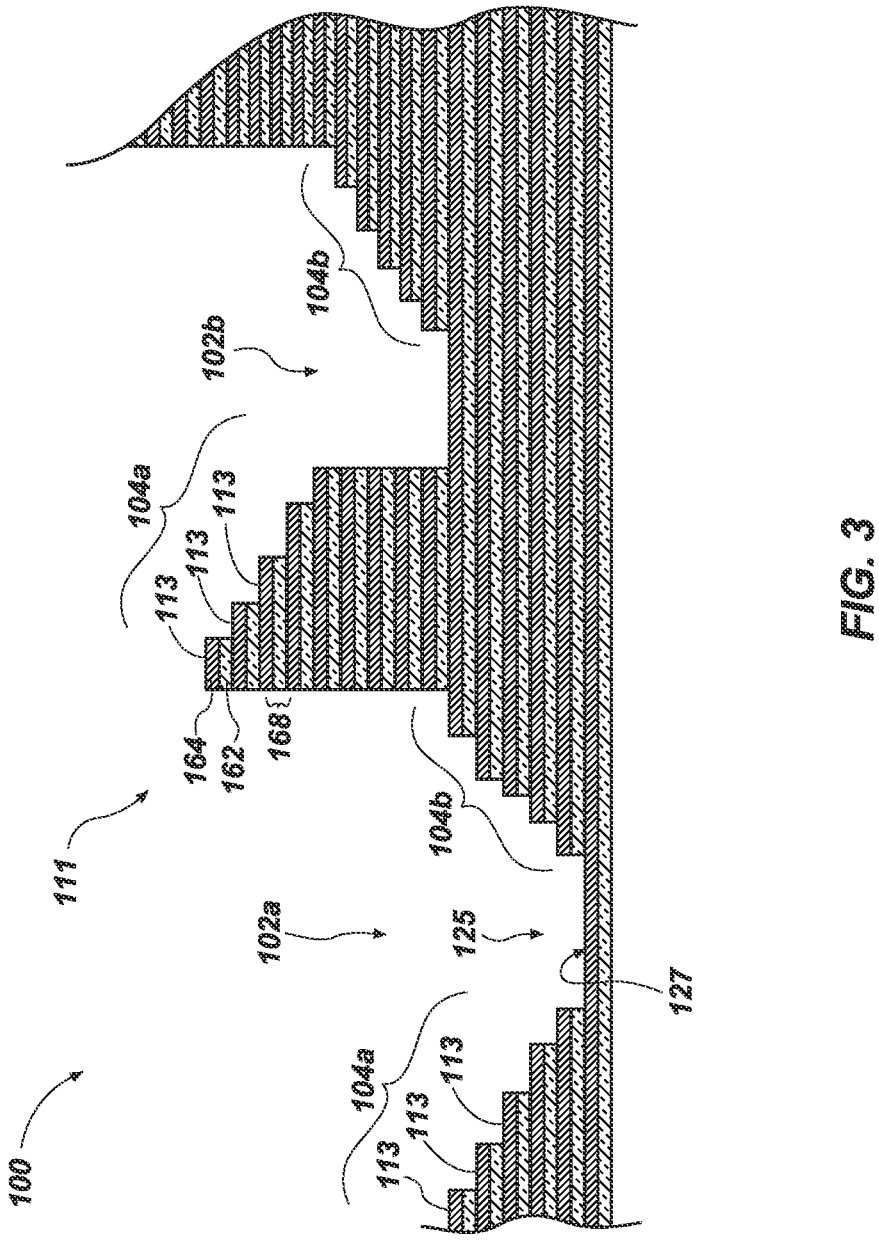
FIG. 3 is an enlarged view of the microelectronic device structure of FIG. 1 within view window C depicted in FIG. 1, in accordance with embodiments of the disclosure.
Figure 3:
Figure 4:
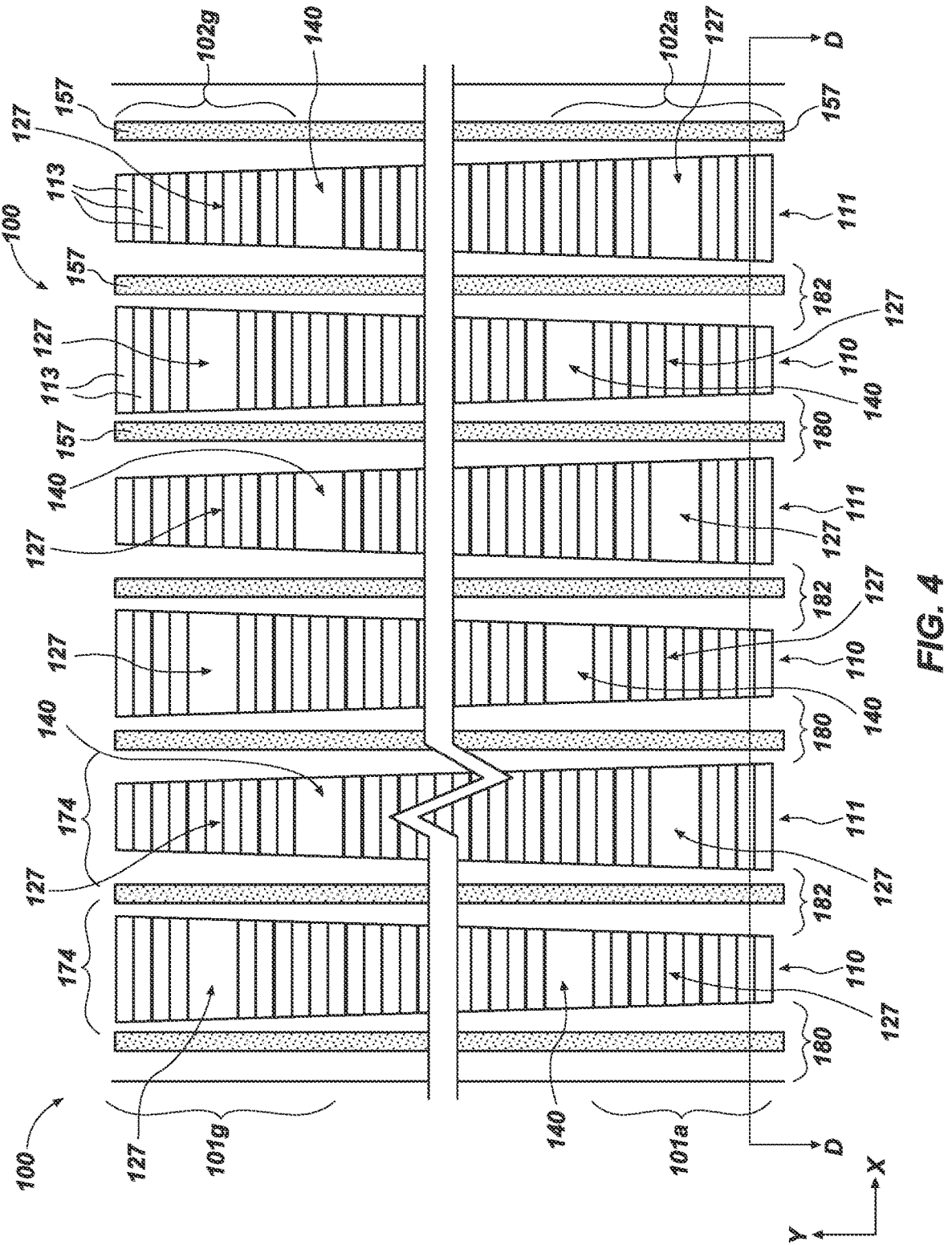
FIG. 4 is a simplified top view of the microelectronic device structure of FIG. 1, in accordance with embodiments of the disclosure.
Figure 5:
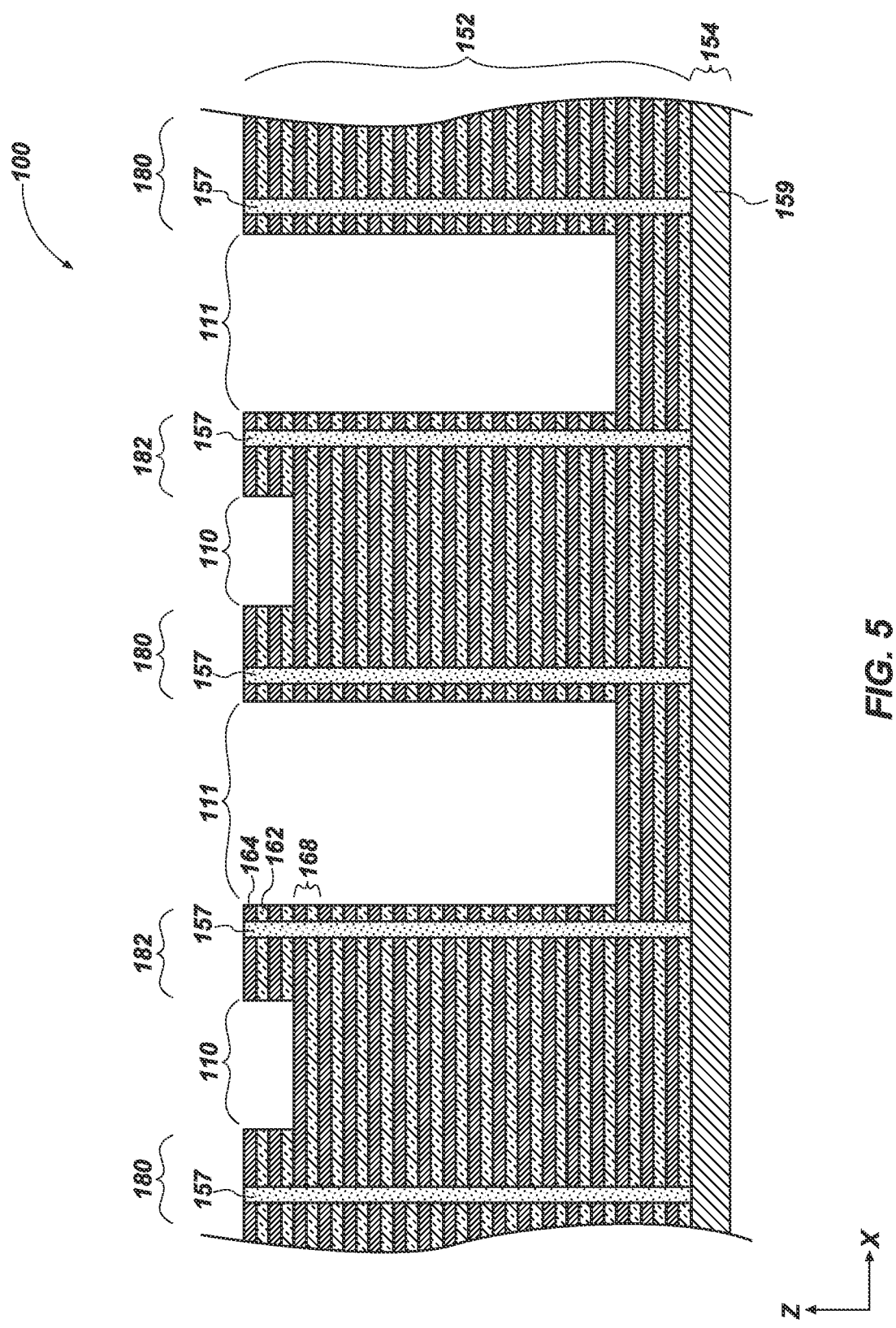
FIG. 5 is a simplified cross-sectional view of the microelectronic device structure taken through section line D-D of FIG. 4.

FIGS. 1-5 depict various simplified views of a microelectronic device structure 100 for a microelectronic device (e.g., a memory device, such as a 3D NAND Flash memory device), in accordance with embodiments of the disclosure. In particular, FIG. 1 is a simplified, partial cross-sectional view of portions of the microelectronic device structure 100. As is discussed in greater detail below, some portions of the microelectronic device structure 100 are not depicted in FIG. 1 to better show certain structures of the microelectronic device structure 100. FIG. 2 is an enlarged view of the microelectronic device structure 100 of FIG. 1 within view window B depicted in FIG. 1. FIG. 3 is an enlarged view of the microelectronic device structure 100 of FIG. 1 within view window C depicted in FIG. 1. FIG. 4 is a simplified top view of the microelectronic device structure 100 of FIG. 1. FIG. 5 is a simplified cross-sectional view of the microelectronic device structure 100 taken through section line D-D of FIG. 4. With the description provided below, it will be readily apparent to one of ordinary skill in the art that the methods and structures described herein may be used for and in various devices and electronic systems.

Referring to FIGS. 1-5 together, the microelectronic device structure 100 may represent a structure post (e.g., subsequent to) one or more so-called "replacement gate" or "gate last" processes. For example, the microelectronic device structure 100 may include a structure formed by at least partially replacing sacrificial materials (e.g., dielectric material, such as dielectric nitride material) of sacrificial structures with one or more conductive materials (e.g., at least one metal, such as tungsten (W)). Replacement gate processing acts may include selectively removing (e.g., selectively etching and/or exhuming) portions of the sacrificial structures of a preliminary stack structure through slots formed in the preliminary stack structure, and then filling the resulting void spaces with conductive material (e.g., W) to form the conductive structures. As is described herein, some of the conductive structures may function as access line structures (e.g., word line structures) for the microelectronic device structure 100, and some other of the conductive structures may function as select gate structures for the microelectronic device structure 100. At least one lower conductive structure of the stack structure formed from the preliminary stack structure may be employed as at least one lower select gate (e.g., at least one source side select gate (SGS)) of the microelectronic device structure 100. In some embodiments, a single (e.g., only one) conductive structure of a vertically lowermost tier of the stack structure is employed as a lower select gate (e.g., a SGS) of the microelectronic device structure 100. In addition, upper conductive structures of the stack structure may be employed as upper select gates (e.g., drain side select gates (SGDs)) of the microelectronic device structure 100. In some embodiments, horizontally neighboring conductive structures of one or more vertically upper tiers of the stack structure are employed as upper select gates (e.g., SGDs) of the microelectronic device structure 100.

As shown in FIGS. 1-4, the microelectronic device structure 100 may include a stack structure 152 including a vertically alternating (e.g., in the Z-direction) sequence of insulative structures 162 and conductive structures 164 (e.g., gate structures, word lines) arranged in tiers 168. Each of the tiers 168 of the stack structure 152 may include at least one of the insulative structures 162 vertically neighboring at least one of the conductive structures 164. The stack structure 152 may include a desired quantity of the tiers 168. For example, the stack structure 152 may include greater than or equal to ten (10) of the tiers 168, greater than or equal to twenty-five (25) of the tiers 168, greater than or equal to fifty (50) of the tiers 168, greater than or equal to one hundred (100) of the tiers 168, greater than or equal to one hundred and fifty (150) of the tiers 168, or greater than or equal to two hundred (200) of the tiers 168 of the insulative structures 162 and the conductive structures 164.

A source tier 154 vertically underlies (e.g., in the Z-direction) the stack structure 152 and includes at least one source structure 159 (e.g., a source plate). The source structure 159 may be formed of and include conductive material, such as one or more of the conductive materials described above. In some embodiments, the source tier 154 includes the at least one source structure 159 and one or more discrete structures.

The insulative structures 162 of the tiers 168 of the stack structure 152 may be formed of and include insulative material, such one or more of the insulative materials described above. In some embodiments, the insulative structures 162 are formed of and include $SiO_x$ (e.g., $SiO_2$). Each of the insulative structures 162 may individually include a substantially homogeneous distribution of the insulative material, or a substantially heterogeneous distribution of the insulative material. In some embodiments, each of the insulative structures 162 is substantially homogeneous. In additional embodiments, at least one of the insulative structures 162 substantially heterogeneous. The insulative structures 162 may, for example, be formed of and include a stack (e.g., laminate) of at least two different insulative materials. The insulative structures 162 of each of the tiers 168 of the stack structure 152 may each be substantially planar, and may each individually exhibit a desired thickness.

The conductive structures 164 of each of the tiers 168 of the stack structure 152 may be formed of and include conductive material, such as one or more of the conductive materials described above. For instance, as noted above, the conductive structures 164 may be formed of and include tungsten (W). The conductive structures 164 may be substantially homogeneous, or may be substantially heterogeneous. In some embodiments, the conductive structures 164 are substantially homogeneous. In additional embodiments, the conductive structures 164 are substantially heterogeneous. The conductive structures 164 of each of the tiers 168 of the stack structure 152 may each be substantially planar, and may each individually exhibit a desired thickness.

The microelectronic device structure 100 may also include distributed stadium regions 110, 111 defined within blocks 174 of the stack structure 152. For clarity, FIG. 1 only depicts portions of two blocks 174 of the microelectronic device structure 100 with other portions removed (e.g., elevated bridge structures) to better show particular structures of the distributed stadium regions 110, 111. In particular, a block 174 of the microelectronic device structure 100 may include a portion of the stack structure 152 of the microelectronic device structure 100 between neighboring slot structures (e.g., slot structures 157). Slots, before being filled with the slot structures, may be utilized in replacement gate processes. An individual (e.g., single, one) block 174 may be interposed between two (2) horizontally neighboring slot structures (e.g., slot structures 157). The microelectronic device structure 100 may include any number of blocks 174 horizontally neighboring each other, as shown in FIG. 4. Stadium structures within the distributed stadium regions 110, 111 of the blocks 174 may individually exhibit a "segmented" configuration, wherein steps thereof to do not horizontally extend to boundaries of the slot structures interposed between horizontally neighboring blocks 174. Within each block 174, elevated bridge structures 180, 182 may be horizontally interposed between at least some of the stadiums structures of the block 174 and the slot structures horizontally neighboring the block 174. In FIG. 1, the elevated bridge structures 180, 182 are not depicted to better show other elements of the microelectronic device structure 100.

The elevated bridge structures 180, 182 may extend along a longitudinal dimension (e.g., height in the Z-direction) of an individual block 174 of the microelectronic device structure 100. Furthermore, the elevated bridge structures 180, 182 may horizontally extend (e.g., in the Y-direction) along lateral sides of the individual block 174. In some embodiments, the elevated bridge structures 180, 182 may include unremoved portions of the stack structure 152 of the microelectronic device structure 100 (e.g., portions of the stack structure 152 of the microelectronic device structure 100 not removed in the process of forming the blocks 174 and the stadium structures within individual blocks 174). In one or more embodiments, the elevated bridge structures 180, 182 have a relatively uniform height along a longitudinal dimension of the individual block 174 of the microelectronic device structure 100.

Referring to FIGS. 1-5 together, stadium structures of distributed stadium regions 110, 111 of laterally neighboring (e.g., in the X-direction) blocks 174 of the microelectronic device structure 100 may ascend in opposing directions along the Y-axis. For example, the microelectronic device structure 100 includes a first distributed stadium region 110 laterally neighboring to a second distributed stadium region 111, and the first distributed stadium region 110 (e.g., the arrangement of stadium structures of the first distributed stadium region 110) ascends in first direction along the Y-axis and the second distributed stadium region 111 (e.g., the arrangement of stadium structures of the second distributed stadium region 111) ascends in a second, opposing direction along the Y-axis. Additionally, the collection of stadium structures of the first distributed stadium region 110 ascends along a same direction along which the collection stadium structures of the second distributed stadium region 111 descends. In other words, in a given direction along the Y-axis, the arrangement of the stadium structures of the first distributed stadium region 110 exhibits an overall negative slope, and the arrangement of the stadium structures of the second distributed stadium region 111 exhibits an overall positive slope. Put yet another way, the arrangement of stadium structures of the first distributed stadium region 110 extends along a first axis oblique to a center plane 181 of the stack structure 152, and the arrangement stadium structures of the second distributed stadium region 111 extends along a second axis oblique to the center plane 181 of the stack structure 152. As a result of the foregoing, an uppermost stadium structure of the first distributed stadium region 110 in the Z-direction (i.e., a vertical direction) is laterally neighboring in the X-direction to a lowermost stadium structure of the second distributed stadium region 111. In view of the foregoing, an arrangement of the stadium structures of the first distributed stadium region 110 and an arrangement of the stadium structures of the second distributed stadium region 111, together, may generally form an X-shape when viewed from the YZ plane (as depicted in FIG. 1). As noted above, elevated bridge structures (e.g., elevated bridge structures 180, 182) may be formed between the stadium structures of the first distributed stadium region 110 and the stadium structures of the second distributed stadium region 111 in the X-direction, and a slot structure 157 may be formed within the elevated bridge structure (FIGS. 4 and 5).

The first distributed stadium region 110 of one of the blocks 174 may include first stadium structures 101a-101g, and the second distributed stadium region 111 of another one of the blocks 174 may include second stadium structures 102a-102g. Each of the first stadium structures 101a-101g may include steps 113 at different elevations (e.g., vertical positions in the Z-direction) relative to steps 113 of the other of the first stadium structures 101a-101g, and each of the second stadium structures 102a-102g may include steps 113 at different elevations (e.g., vertical positions in the Z-direction) relative to steps 113 of the other of the second stadium structures 102a-102g. The steps 113 may be defined by edges (e.g., horizontal ends) of at least some of the tiers 168 of the stack structure 152. The steps 113 of the first stadium structures 101a-101g and the second stadium structures 102a-102g may serve as contact regions for different tiers of the stack structure 152. Additionally, each of the first stadium structures 101a-101g may include a first stair step structure 103a and an additional first stair step structure 103b, and each of the second stadium structures 102a-102g may include a second stair step structure 104a and an additional second stair step structure 104b. In some embodiments, the first stair step structure 103a is vertically offset from the additional first stair step structure 103b. As a result, each step 113 of the first stair step structure 103a is at a higher elevation in the Z-direction than any of the steps 113 of the additional first stair step structure 103b. Likewise, the second stair step structure 104a is vertically offset from the additional second stair step structure 104b. Each of the first stair step structure 103a and the second stair step structure 104a may individually exhibit a generally negative slope; and each of the additional first stair step structure 103b and the additional second stair step structure 104b may individually exhibit a generally positive slope. Horizontal centers (e.g., in the Y-direction) of individual first stadium structures 101a-101g of the first distributed stadium region 110 may be substantially horizontally aligned (e.g., in the X-direction orthogonal to the Y-direction) with horizontal centers (e.g., in the Y-direction) of individual corresponding second stadium structures 102a-102g of the second distributed stadium region 111.

Each of the first and second distributed stadium regions 110, 111 within the blocks 174 may include upper stadium structures and lower stadium structures. The upper stadium structures may be formed above (e.g., at a higher elevation vertically than) a center plane 181 of the stack structure 152, and the lower stadium structures may be formed below (e.g., at a lower elevation vertically than) the center plane 181 of the stack structure 152. In some embodiments, each of the first and second distributed stadium regions 110, 111 includes a center stadium structure that intersects the center plane 181.

Valleys 125 may be located between the first stair step structure 103a and the additional first stair step structure 103b of each of the first stadium structures 101a-101g and between the second stair step structure 104a and the additional second stair step structure 104b of each of the second stadium structures 102a-102g. Furthermore, the valleys 125 may define valley floors 127 that extend horizontally between the first stair step structure 103a and the additional first stair step structure 103b of each of the first stadium structures 101a-101g and between the second stair step structure 104a and the additional second stair step structure 104b of each of the second stadium structures 102a-102g. Additionally, within a given block 174, upper stadium structures may include valleys 125 having valley floors 127 that have smaller widths within the Y-direction relative to widths of valley floors 127 of valleys 125 of lower stadium structures. For example, along a longitudinal length of a given distributed stadium region (e.g., the first or second distributed stadium regions 110, 111) of a given block 174 and from an uppermost stadium structure to a lowermost stadium structure within the distributed stadium region, the widths of the valley floors 127 of the valleys 125 of the stadium structures incrementally increase in the Y-direction from stadium structure to stadium structure. As will be recognized by one of ordinary skill in the art, the valleys 125 may ultimately be filled with an insulative material (not shown).

A region between neighboring stadium structures (e.g., the first stadium structure 101a and first stadium structure 101b) of a given block 174 may include elevated crest region 140, which may also be referred to as "crest region 140." Within a given distributed stadium region (e.g., the first or second distributed stadium regions 110, 111), upper neighboring stadium structures (e.g., stadium structures neighboring each other in the Y-direction) may include a crest region 140 between the upper neighboring stadium structures. Furthermore, within the given distributed stadium region (e.g., the first or second distributed stadium regions 110, 111), lower neighboring stadium structures may not include a crest region 140 between one or more of the lower neighboring stadium structures or may include a reduced (i.e., thinner) crest region 140 between the neighboring stadium structures relative to upper neighboring stadium structures. In some embodiments, along a longitudinal length of a given distributed stadium region (e.g., the first or second distributed stadium regions 110, 111) and from an uppermost stadium structure to a lowermost stadium structure of the given distributed stadium region, crest regions 140 between neighboring stadium structures incrementally become thinner in the Y-direction and, ultimately, become removed (e.g., absent) completely. For instance, the second distributed stadium region 111 may lack a crest region 140 between at least one set of neighboring lower stadium structures of the second distributed stadium region 111.

Forming the stadium structures of the distributed stadium regions 110, 111 prior to the replacement gate processes described herein may include performing removal processes (e.g., patterning and chops) to form crest regions 140 between upper stadium structures to have widths (W) within a range of about 2.0 μm and about 6.0 μm. For example, forming the stadium structures of the distributed stadium regions 110, 111 may include performing removal processes (e.g., patterning and chops) to form crest regions 140 between upper stadium structures to have widths (W) of about 4.0 μm. Forming and finalizing vertical positions of the lower (e.g., deep) stadium structures via removal processes (e.g., chops) may result in lateral expansion (also referred to herein as "walkout") of the trenches/slots utilized to form and finalize vertical positions of the lower stadium structures within the microelectronic device structure 100. For example, forming deep trenches/slots to form and finalize vertical positions of the lower stadium structures within the microelectronic device structure 100 results in lateral expansion (e.g., walkout) of the trenches/slots in the X-direction and the Y-direction, as show in FIGS. 1, 3, 4, and 5. In some embodiments, widths (W) of the crest regions 140 or portions of patterns and masks utilized in formation of the lower stadium structures and correlating to crest regions 140 are selected such that an area typically occupied by a crest region between lower stadium structures may be utilized (e.g., eroded) to absorb expansion (i.e., walkout) in the Y-direction. For instance, as depicted within FIGS. 1, 3, and 4, at least some lower neighboring stadiums in the Y-direction within a given block (e.g., distributed stadium region 111) may not have crest regions 140 between the lower neighboring stadiums in the Y-direction.

The removal processes utilized to form and finalize vertical positions of the stadium structures within the microelectronic device structure 100 may include conventional material removal processes (e.g., conventional etching processes, such as conventional dry etching processes) and conventional processing equipment, which are not described in detail herein. By way of non-limiting example, the removal processes may include anisotropic etching (e.g., anisotropic dry etching, such as one or more of reactive ion etching (RIE), deep RIE, plasma etching, reactive ion beam etching, and chemically assisted ion beam etching or anisotropic wet etching) to form the trenches/slots to form and finalize vertical positions of the lower stadium structures within the microelectronic device structure 100. Furthermore, referring to FIGS. 1-5 together, as noted above, due to the expansion (e.g., walkout) during formation of the lower stadium structures, the valley floors 127 of the valleys 125 of the lower stadium structures may have increased widths in the Y-direction relative to valley floors 127 of the valleys 125 of the upper stadium structures.

Referring to FIGS. 4 and 5 together, due to the lateral expansion (e.g., walkout) of the trenches/slots during formation of the lower (e.g., deep) stadium structures, the lower stadium structures and steps 113 of the lower stadium structures may have an increased width in X-direction relative to upper stadium structures and steps 113 of the upper stadium structures. It is noted that, the number of stadiums depicted in FIG. 4 and the number of tiers 168 depicted in FIG. 5 are reduced for clarity and ease of illustration. The lowermost (e.g., deepest) stadium structure of a given block may be a widest stadium structure of the given block in the X-direction, and the uppermost stadium structure of the given block may be the narrowest stadium structure of the given block in the X-direction. Due to the increased width of the lower (e.g., deep) stadium structures in the X-direction, an amount (e.g., width) of material of elevated bridge structures 180, 182 between the lower stadium structures and slot structures 157 within the elevated bridge structures 180, 182 may be decreased relative to (e.g., smaller than) an amount (e.g., width) of material of elevated bridge structures 180, 182 between the upper stadium structures and the slot structures 157. Accordingly, along a direction extending from an uppermost stadium structure to a lowermost stadium structure of a given distributed stadium region 110, 111, an amount (e.g., width) of material of elevated bridge structures 180, 182 between the stadium structures of the given distributed stadium region 110, 111 and the slot structures 157 may decrease. In some embodiments, the amount (e.g., width) of material of elevated bridge structures 180, 182 between the stadium structures of the given distributed stadium region 110, 111 and the slot structures 157 gradually increases or decreases. As a result, the elevated bridge structures 180, 182 may have a slanted orientation relative to the Y-direction. For example, the elevated bridge structures 180, 182 extend in a direction oblique to the Y-direction. Furthermore, the elevated bridge structures 180, 182 may have a substantially consistent overall width along the Y-direction. In additional embodiments, amount (e.g., width) of material of elevated bridge structures 180, 182 between the stadium structures of the given distributed stadium region 110, 111 and the slot structures 157 decreases or increases in a stepped manner (e.g., abruptly).

Furthermore, as discussed above, laterally neighboring distributed stadium regions 110, 111 of the microelectronic device structure 100 may include arrangements of stadium structures ascending in opposing directions along the Y-axis. For example, the microelectronic device structure 100 includes a horizontally alternating sequence of distributed stadium regions 110, 111 (e.g., one in each of the blocks 174) ascending in differing directions. As a result, a lowermost stadium structure of a first distributed stadium region 110 within one of the blocks 174 is laterally neighboring to an uppermost stadium structure of a second distributed stadium region 111 within a laterally neighboring one of the blocks 174. Additionally, lower stadiums structures of the first distributed stadium region 110 are laterally neighboring to upper stadium structures of the second distributed stadium region 111, and lower stadiums structures of the second distributed stadium region 111 are laterally neighboring to upper stadium structures of the first distributed stadium region 110. Furthermore, each of the stadium structures of the first distributed stadium region 110, except a center stadium structure, is laterally neighboring to a respective stadium structure of the second distributed stadium region 111 and is at a different elevation than the respective stadium structure of the second distributed stadium region 111. Moreover, laterally neighboring stadium structures of laterally neighboring distributed stadium regions 110, 111 may be spaced vertically apart from the center plane 181 (FIG. 1) of the stack structure 152 (e.g., a horizontal plane (FIG. 1) within which the laterally neighboring block(s) 174 cross) by substantially a same distance. For example, a lowermost stadium structure of a first distributed stadium region 110 and an uppermost stadium structure of a second distributed stadium region 111 may be spaced vertically apart from the center plane 181 by substantially a same distance. Additionally, a second lowermost stadium structure of the first distributed stadium region 110 and a second uppermost stadium structure of the second distributed stadium region 111 may be spaced vertically apart from the center plane 181 by substantially a same distance. Put another way, each stadium structure of the first distributed stadium region 110 is vertically spaced apart from the center plane 181 of the stack structure 152 by a same distance by which a respective, laterally neighboring stadium structure of the second distributed stadium region 111 is spaced apart from the center plane 181.

Referring still to FIGS. 1-5 together, in alternative embodiments, the stadium structures of the distributed stadium regions 110, 111 may not be oriented relative to one another in a general ascending or descending manner. Rather, along the Y-axis and from a first stadium structure of a given distributed stadium region 110, 111 to a last stadium structure of the given distributed stadium region 110, 111 along the Y-axis, the vertical elevations of the stadium structures may be irregular or may appear random relative to one another. Alternatively, along the Y-axis and from a first stadium structure of a given distributed stadium region 110, 111 to a last stadium structure of the given distributed stadium region 110, 111, the stadium structures converge toward or diverge from the center plane 181 of the stack structure 152. For example, along the Y-axis and from a first stadium structure of a given distributed stadium region 110, 111 to a last stadium structure of the given distributed stadium region 110, 111, a first stadium structure of the given distributed stadium region 110, 111 includes an uppermost stadium, a second sequential stadium structure includes a lowermost stadium structure, a third sequential stadium structure includes a second uppermost stadium, a fourth sequential stadium structure includes a second lowermost stadium structure, and so on and so forth to the last stadium structure of the given distributed stadium region 110, 111.

Regardless, even in embodiments, where the vertical elevations of the stadium structures of a given block are irregular or appear random relative to one another or the stadium structures of the given distributed stadium region converge toward or diverge from the center plane 181 of the stack structure 152, a lowermost stadium structure of a first distributed stadium region 110 is laterally neighboring to an uppermost stadium structure of a second, laterally neighboring distributed stadium region 111. Furthermore, lower stadium structures of the first distributed stadium region 110 are laterally neighboring to upper stadium structures of the second distributed stadium region 111. Moreover, laterally neighboring stadium structures of the distributed stadium regions 110, 111 of laterally neighboring blocks 174 are spaced vertically apart from the center plane 181 (FIG. 1) of the stack structure 152.

Referring to FIGS. 1-5 together, because a lowermost stadium structure of a first distributed stadium region 110 of the microelectronic device structure 100 is laterally neighboring to an uppermost stadium structure of a second, laterally neighboring distributed stadium region 111, and because laterally neighboring stadium structures of laterally neighboring distributed stadium regions 110, 111 are spaced vertically apart from the center plane 181 of the stack structure 152, the microelectronic device structures 100 provides advantages over conventional structures. For example, because lowermost stadium structures are not laterally neighboring to each other as in conventional structures, an elevated bridge structure 180, 182 laterally adjacent to (e.g., framing) a lowermost stadium structure of a first of the blocks 174 neighbors an elevated bridge structure 180. 182 laterally adjacent to an uppermost stadium structure of a second of the second of the blocks 174 neighboring the first of the blocks 174. Thus, the critical dimensions of the elevated bridge structures 180, 182 of the first of the blocks 174 may be inversely related to the critical dimensions of the elevated bridge structures 180, 182 portions of the second of the blocks 174 along horizontal dimensions (e.g., in the Y-direction) of the block 174. Accordingly, mechanical strength and stability of some of the elevated bridge structures 180, 182 at a given horizontal position (e.g., in the Y-direction) within the microelectronic device structures 100 are increased relative to conventional configurations. Increasing mechanical strength and stability of different elevated bridge structures at different horizontal positions within the microelectronic device structure 100 increases durability and mechanical strength of the microelectronic device structures 100.

Moreover, by increasing mechanical strength and stability of the elevated bridge structures and overall mechanical strength of the microelectronic device structures 100, the methods and structures described herein provide one or more of improved performance, reliability, and durability, lower costs, increased miniaturization of components, improved pattern quality, and greater packaging density as compared to conventional structures, conventional devices, and conventional systems.

Additionally, because the lower stadium structures of neighboring blocks 174 are not horizontally aligned with one another, as in conventional configurations, thicker resists may be utilized in forming the lower stadium structures, which results in less bow in etching profiles. Less bow in etching profiles improves accuracy of forming the microelectronic device structures 100 and reliability of the microelectronic device structures 100.

Furthermore, as discussed above, by selecting crest region widths and utilizing crest regions (e.g., crest region 140) to absorb lateral expansion during trench/slot formation, stadium structure size and/or block size may be reduced in at least the Y-direction. Reducing stadium structure size and/or block size provides one or more of improved performance, reliability, and durability, lower costs, increased miniaturization of components, improved pattern quality, and greater packaging density as compared to conventional structures, conventional devices, and conventional systems.

Figure 6:
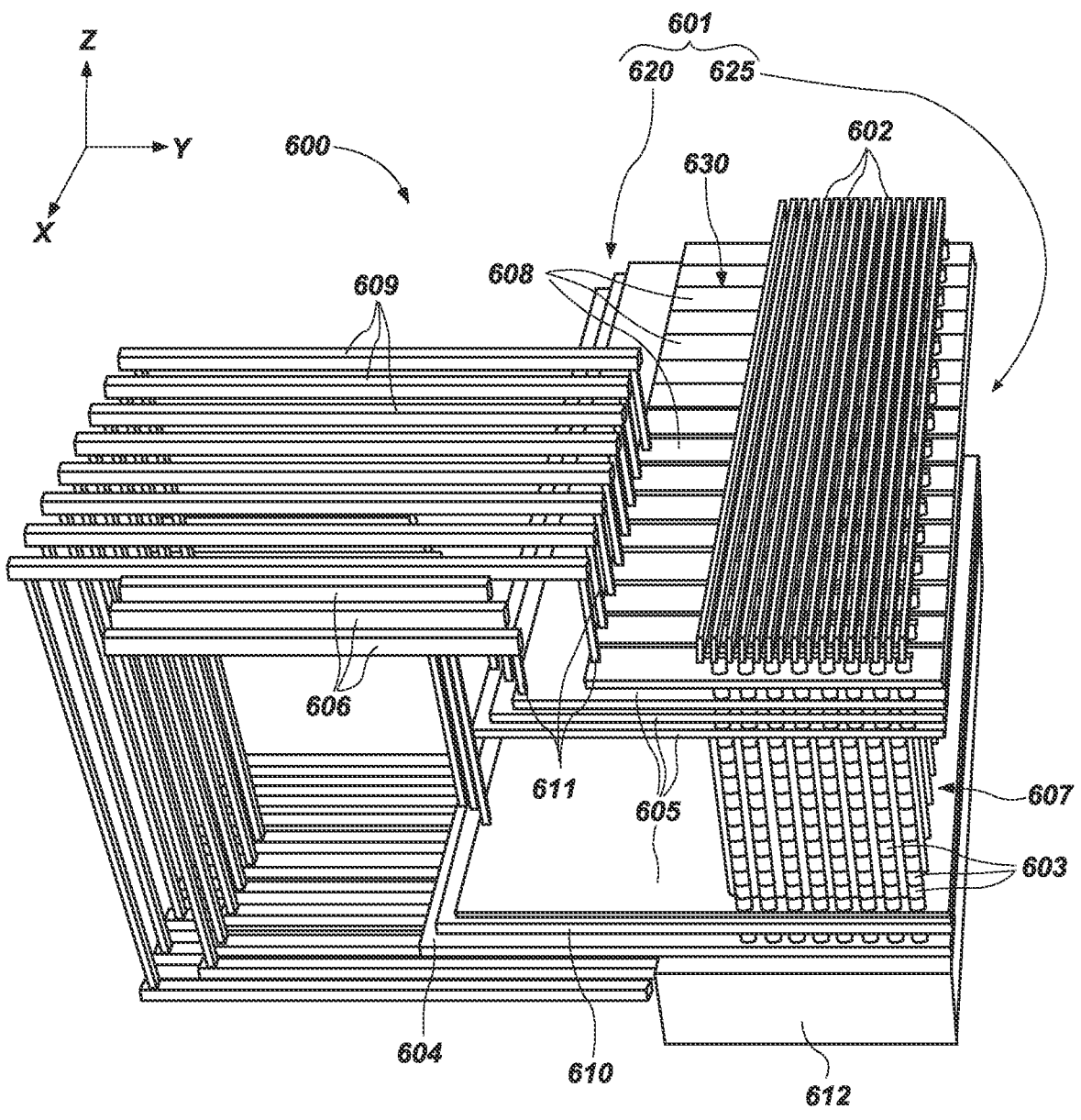
FIG. 6 is a simplified, cutaway perspective view of a microelectronic device, according to embodiments of the disclosure.

FIG. 6 illustrates a partial cutaway perspective view of a portion of a microelectronic device 600 (e.g., a memory device, such as a 3D NAND Flash memory device) including a microelectronic device structure 601. The microelectronic device structure 601 may be substantially similar to the microelectronic device structure 100 previously described with reference to FIGS. 1-5; and may be formed, in part, in accordance with processes described herein. As shown in FIG. 6, the microelectronic device structure 601 may include a stack structure 625 (e.g., corresponding to the stack structure 152 (FIGS. 1-3)) and at least one stair step structure 620 (e.g., corresponding to the stair step structures 103a, 103b, 104a, 104b (FIGS. 1-3)) within the stack structure 625 and defining contact regions for connecting access lines 606 to conductive structures 605 (e.g., corresponding to the conductive structures 164 (FIGS. 1-3)). The microelectronic device structure 601 may include vertical strings 607 of memory cells 603 coupled to each other in series. The vertical strings 607 may extend vertically (e.g., in the Z-direction) and orthogonally to the conductive structures 605 and to conductive lines, such as data lines 602, a source structure 604 (e.g., corresponding to the source tier 154 (FIG. 1)), the access lines 606, first select gates 608 (e.g., upper select gates, drain select gates (SGDs), such as the conductive structures 164 (FIGS. 1-3)), select lines 609, and a second select gate 610 (e.g., a lower select gate, a source select gate (SGS)). The first select gates 608 may be horizontally separated (e.g., in the X-direction) from one another by filled slots 630.

Vertical conductive contacts 611 may couple components to each other as shown. For example, the select lines 609 may be coupled to the first select gates 608 and the access lines 606 may be coupled to the conductive structures 605. The microelectronic device 600 may also include a control unit 612 positioned under the vertical strings 607 of memory cells 603. The control unit 612 may include at least one logic region including logic devices configured to control various operations of other features (e.g., the vertical strings 607 of memory cells 603) of the microelectronic device 600. For example, the logic region of the control unit 612 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), buffers (e.g., page buffers), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC)

devices, self-refresh/wear leveling devices, and other chip/deck control circuitry. The logic circuity of the logic region of the control unit 612 may be coupled to the data lines 602, the source tier 604, the access lines 606, the first select gates 608, and the second select gates 610, for example. In some embodiments, the logic region of the control unit 612 includes CMOS (complementary metal-oxide-semiconductor) circuitry. In some such embodiments, the logic region of the control unit 612 may be characterized as having a "CMOS under Array" ("CuA") configuration, wherein the CMOS circuitry of the logic region is at least partially (e.g., substantially) positioned within a horizontal area of the memory array region (including the vertical strings 607 of memory cells 603 therein) of the microelectronic device 600.

Thus, in accordance with embodiments of the disclosure, a microelectronic device includes a stack structure comprising a vertically alternating sequence of conductive structures and insulating structures arranged in tiers, the stack structure further comprising: a first block comprising first stadium structures having steps comprising horizontal ends of the tiers, an arrangement of the first stadium structures ascending from a lowermost first stadium structure to an uppermost first stadium structure in a first horizontal direction and a second block neighboring the first block in a second horizontal direction orthogonal to the first horizontal direction and comprising second stadium structures having additional steps comprising additional horizontal ends of the tiers, an arrangement of second stadium structures descending from an uppermost second stadium structure to a lowermost second stadium structure in the first horizontal direction.

Additional embodiments of the disclosure include a microelectronic device, including a stack structure comprising tiers of conductive structures vertically interleaved with insulative structure, the stack structure further comprising: a first block comprising: upper first stadium structures vertically above a center plane of the stack structure; and lower first stadium structures vertically below the center plane of the stack structure; and a second block laterally neighboring the first block and comprising: upper second stadium structures vertically above the center plane of the stack structure; and lower second stadium structures vertically below the center plane of the stack structure, wherein an uppermost one of the upper first stadium structures of the first block is horizontally aligned with a lowermost one of the lower second stadium structures of the second block.

Embodiments of the disclosure further include a method of forming a microelectronic device. The method may include forming, within a stack structure comprising a first material vertically interleaved with a second material, a first block comprising first stadium structures having stepped profiles, the first stadium structures at differing elevations than one another within stack structure; and forming, within the stack structure, a second block laterally neighboring the first block and comprising second stadium structures having additional stepped profiles, the second stadium structures at additional differing elevations than one another within stack structure, wherein a lateral center of an uppermost one of the first stadium structures of the first block is formed to be substantially aligned with a lateral center of to a lowermost one of the second stadium structures of the second block, and wherein a lateral center of an uppermost one of the second stadium structures of the second block is formed to be substantially aligned with a lateral center of a lowermost one of the first stadium structures of the first block.

Further embodiments of the disclosure include a memory device including a stack structure comprising tiers each comprising a conductive material and an insulative material vertically neighboring the conductive material, the stack structure divided into blocks extending in parallel in a first direction and separated from one another in a second direction by dielectric slot structures, the blocks comprising: a first block comprising: first stadium structures comprising staircase structures individually having steps comprising horizontal ends of at least some the tiers of the stack structure; and first elevated regions neighboring sides of the first stadium structures in the second direction; a second block neighboring the first block and comprising: second stadium structures comprising additional staircase structures individually having additional steps comprising additional horizontal ends of the at least some the tiers of the stack structure, a vertical positioning arrangement of the second stadium structures in the first direction inverted relative to that of the first stadium structures of the first block; and second elevated regions neighboring sides of the second stadium structures in the second direction; and strings of memory cells vertically extending through the first block and the second block of the stack structure.

Figure 7:
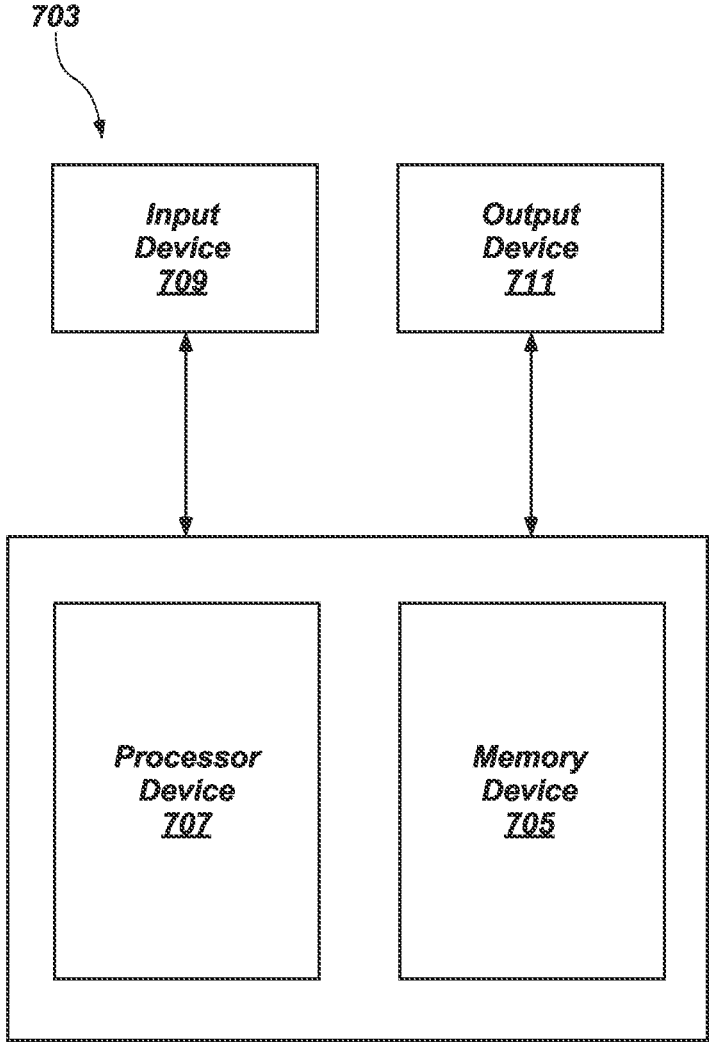
FIG. 7 is a schematic block diagram of an electronic system, in accordance with embodiments of the disclosure.

Referring next to FIG. 7, depicted is a schematic block diagram of an electronic system 703, in accordance with embodiments of the disclosure. The electronic system 703 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 703 includes at least one memory device 705. The memory device 705 may include, for example, an embodiment of a microelectronic device structure previously described herein (e.g., the microelectronic device structure 100) or a microelectronic device (e.g., the microelectronic device 600) previously described herein.

The electronic system 703 may further include at least one electronic signal processor device 707 (often referred to as a "microprocessor"). The electronic signal processor device 707 may, optionally, include an embodiment of a microelectronic device or a microelectronic device structure previously described herein (e.g., one or more of the microelectronic device 600 and the microelectronic device structure 100). The electronic system 703 may further include one or more input devices 709 for inputting information into the electronic system 703 by a user, such as, for example, a mouse or other pointing device, a keyboard, a touchpad, a button, or a control panel. The electronic system 703 may further include one or more output devices 711 for outputting information (e.g., visual or audio output) to a user such as, for example, a monitor, a display, a printer, an audio output jack, a speaker, etc. In some embodiments, the input device 709 and the output device 711 may comprise a single touchscreen device that can be used both to input information to the electronic system 703 and to output visual information to a user. The input device 709 and the output device 711 may communicate electrically with one or more of the memory device 705 and the electronic signal processor device 707.

Figure 8:
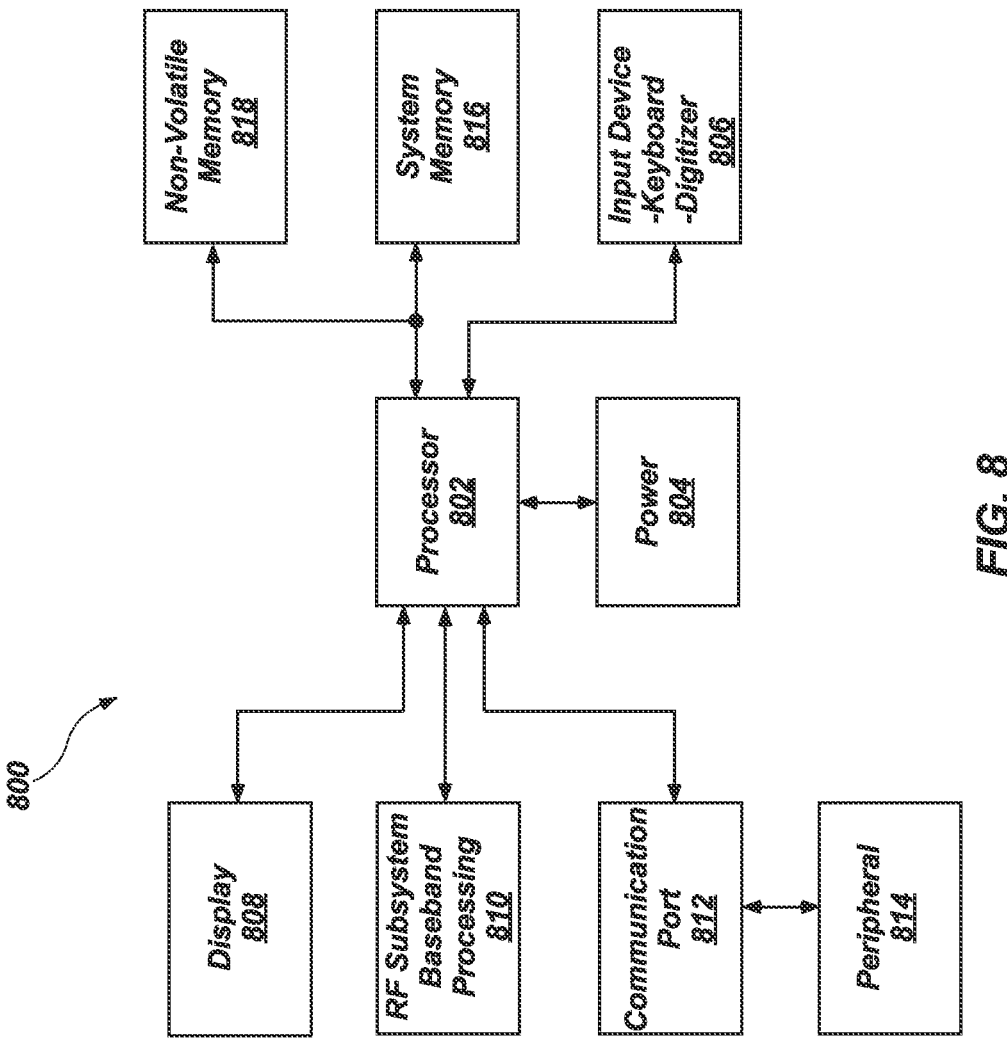
FIG. 8 is a schematic block diagram of a processor-based system, in accordance with embodiments of the disclosure.

With reference to FIG. 8, depicted is a processor-based system 800. The processor-based system 800 may include various microelectronic devices and microelectronic device structures (e.g., microelectronic devices and microelectronic device structures including one or more of the microelectronic device 600 and the microelectronic device structure 100) manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include microelectronic devices and microelectronic device structures (e.g., microelectronic devices and microelectronic device structures including one or more of the microelectronic device 600 or the microelectronic device structure 100) manufactured in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include semiconductor devices, such as the microelectronic devices and microelectronic device structures (e.g., the microelectronic device 600 and the microelectronic device structure 100) described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the non-volatile memory 818 is typically selected to be just large enough to store any necessary operating system, application programs, and fixed data. Additionally, the non-volatile memory 818 may include a high-capacity memory such as disk drive memory, such as a hybrid-drive including resistive memory or other types of non-volatile solid-state memory, for example. The non-volatile memory 818 may include microelectronic devices, such as the microelectronic devices and microelectronic device structures (e.g., the microelectronic device 600 and the microelectronic device structure 100, 201, 301) described above, or a combination thereof.

Thus, in accordance with embodiments of the disclosure, an electronic system, including an input device, an output device, a processor device operably coupled to the input device and the output device, and a memory device operably coupled to the processor device and comprising at least one microelectronic device. The at least one microelectronic device may include first stadium structures within a first block of a stack structure; and second stadium structures within a second laterally adjacent block of the stack structure, each of the first stadium structures being laterally adjacent to a respective one of the second stadium structures and at a different elevation than the respective one of the second stadium structures, wherein each of the first stadium structures is vertically spaced apart from a center plane of the stack structure by a same distance by which the respective one of the second stadium structures is spaced apart from the center plane.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a stack structure comprising a vertically alternating sequence of conductive structures and insulating structures arranged in tiers, the stack structure further comprising:
   a first block comprising first stadium structures having steps comprising horizontal ends of the tiers,
      an arrangement of the first stadium structures ascending from a lowermost first stadium structure having a lowermost step of the first stadium structures to an uppermost first stadium structure having an uppermost step of the first stadium structures in a first horizontal direction; and a second block neighboring the first block in a second horizontal direction orthogonal to the first horizontal direction and comprising second stadium structures having additional steps comprising additional horizontal ends of the tiers, an arrangement of second stadium structures descending from an uppermost second stadium structure having an uppermost additional step of the second stadium structures to a lowermost second stadium structure having a lowermost additional step of the second stadium structures in the first horizontal direction, the lowermost second stadium structure of the second block horizontally aligned with the uppermost first stadium structure of the first block, first crest regions between pairs of the first stadium structures neighboring one another within the first block, wherein an uppermost surface of at least one crest region of the first crest regions is disposed at a height of an uppermost surface of the first block; and second crest regions between pairs of the second stadium structures neighboring one another within the second block, wherein an uppermost surface of at least one crest region of the second crest regions is disposed at a height of an uppermost surface of the second block.

2. The microelectronic device of claim 1, further comprising a dielectric slot structure interposed between the first block and the second block in the second horizontal direction.

3. The microelectronic device of claim 2, wherein:

the first block of the stack structure further comprises first bridge structures interposed between the first stadium structures and the dielectric slot structure in the second horizontal direction; and the second block of the stack structure further comprises second bridge structures interposed between the second stadium structures and the dielectric slot structure the second horizontal direction.

4. The microelectronic device of claim 1, wherein horizontal centers of the uppermost first stadium structure of the first block and the lowermost second stadium structure of the second block are substantially horizontally aligned within one another in the second horizontal direction.

5. The microelectronic device of claim 1, wherein the first crest regions incrementally decrease in width in the first horizontal direction from the uppermost first stadium structure to the lowermost first stadium structure of the first block.

6. The microelectronic device of claim 5, wherein the lowermost first stadium structure of the first stadium structures and another of the first stadium structures neighboring the lowermost first stadium structure do not include one of the first crest regions interposed therebetween.

7. A microelectronic device, comprising:

a stack structure comprising tiers of conductive structures vertically interleaved with insulative structure, the stack structure further comprising:

a first block comprising:

upper first stadium structures vertically above a center plane of the stack structure;

lower first stadium structures vertically below the center plane of the stack structure; and first crest regions disposed between at least two of the upper first stadium structures, wherein an uppermost surface of at least one crest region of the first crest regions is disposed at a height of an uppermost surface of the first block;

a second block laterally neighboring the first block and comprising:

upper second stadium structures vertically above the center plane of the stack structure;

lower second stadium structures vertically below the center plane of the stack structure, and second crest regions disposed between at least two of the upper second stadium structures, wherein an uppermost surface of at least one crest region of the second crest regions is disposed at a height of an uppermost surface of the second block; and wherein an uppermost one of the upper first stadium structures having an uppermost step of the first stadium structures of the first block is horizontally aligned with a lowermost one of the lower second stadium structures having a lowermost additional step of the second stadium structures of the second block.

8. The microelectronic device of claim 7, wherein the upper first stadium structures and the lower first stadium structures of the first block are oriented along a first axis oblique to the center plane of the stack structure.

9. The microelectronic device of claim 8, wherein vertical centers of the upper second stadium structures of the second block and vertical centers of the lower second stadium structures of the second block are aligned along a second axis oblique to the center plane of the stack structure.

10. The microelectronic device of claim 7, wherein an uppermost one of the upper second stadium structures of the second block is horizontally aligned with a lowermost one of the lower first stadium structures of the first block.

11. The microelectronic device of claim 7, wherein each of the tiers individually comprises one of the conductive structures and one of the insulating structures.

12. The microelectronic device of claim 7, further comprising:

a dielectric slot structure horizontally interposed between the first block and the second block;

first bridge structures horizontally interposed between the dielectric slot structure and each of the upper first stadium structures and the lower first stadium structures, the first bridge structures comprising relatively elevated portions of the stack structure; and second bridge structures horizontally interposed between the dielectric slot structure and each of the upper second stadium structures and the lower second stadium structures, the second bridge structures comprising additional relatively elevated portions of the stack structure.

13. The microelectronic device of claim 7, wherein each of the first block and the second block comprises a respective center stadium structure intersecting the center plane.

14. A memory device, comprising:

a stack structure comprising tiers each comprising a conductive material and an insulative material vertically neighboring the conductive material, the stack structure divided into blocks extending in parallel in a first direction and separated from one another in a second direction by dielectric slot structures, the blocks comprising:

a first block comprising:

first stadium structures comprising staircase structures individually having steps comprising horizontal ends of at least some the tiers of the stack structure;

first elevated regions neighboring sides of the first stadium structures in the second direction; and first additional elevated regions neighboring opposing ends of the first stadium structures in the first direction, uppermost surfaces of the first additional elevated regions substantially coplanar with uppermost surfaces of the first elevated regions; and a second block neighboring the first block and comprising:

second stadium structures comprising additional staircase structures individually having additional steps comprising additional horizontal ends of the at least some the tiers of the stack structure, a vertical positioning arrangement of the second stadium structures in the first direction inverted relative to that of the first stadium structures of the first block, and centers of the second stadium structures substantially aligned with centers of the first stadium structures in the first direction;

second elevated regions neighboring sides of the second stadium structures in the second direction;

second additional elevated regions neighboring opposing ends of the second stadium structures in the first direction, uppermost surfaces of the second additional elevated regions substantially coplanar with uppermost surfaces of the second elevated regions, and widths, in the second direction, of at least some of the first elevated regions of the first block different than additional widths, in the second direction, of at least some of the second elevated regions most proximate to the at least some of the first elevated regions; and strings of memory cells vertically extending through the first block and the second block of the stack structure.

15. The memory device of claim 14, wherein a width, in the second direction, of one of the first elevated regions laterally adjacent an uppermost one of the first stadium structures is greater than a width, in the second direction, of one of the second elevated regions laterally adjacent a lowermost one of the second stadium structures substantially aligned with the an uppermost one of the first stadium structures in the first direction.

* * * * *